US009986310B2

(12) United States Patent
Sobanski et al.

(10) Patent No.: US 9,986,310 B2
(45) Date of Patent: May 29, 2018

(54) MULTI-STAGE SENSING/CONTROL/IDENTIFICATION DEVICE HAVING PROTECTED COMMUNICATION AND REMOTE POWER

(71) Applicant: United Technologies Corporation, Farmington, CT (US)

(72) Inventors: Kurt J. Sobanski, Glastonbury, CT (US); Joseph V. Mantese, Ellington, CT (US); Brian L. McCabe, Orange, CT (US); Joseph Zacchio, Wethersfield, CT (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 0 days. days.

(21) Appl. No.: 15/255,364

(22) Filed: Sep. 2, 2016

(65) Prior Publication Data
US 2016/0373837 A1 Dec. 22, 2016

Related U.S. Application Data

(66) Continuation-in-part of application No. 15/114,234, filed as application No. PCT/US2015/016761 on Feb.
(Continued)

(51) Int. Cl.
*H04Q 1/02* (2006.01)
*H04Q 9/00* (2006.01)
(Continued)

(52) U.S. Cl.
CPC .......... *H04Q 1/116* (2013.01); *F01D 21/003* (2013.01); *F02C 3/04* (2013.01); *F02C 9/00* (2013.01);
(Continued)

(58) Field of Classification Search
CPC . H04Q 1/116; H04Q 1/28; H04Q 9/00; H04Q 2209/40; H04W 84/12;
(Continued)

(56) References Cited

U.S. PATENT DOCUMENTS 7,464,603 B2 12/2008 Bauer et al.
8,111,161 B2 * 2/2012 Lee .................... F01D 17/02
340/10.1
(Continued)

FOREIGN PATENT DOCUMENTS

CN 102169104 A 8/2011
CN 102735326 A 10/2012
(Continued)

OTHER PUBLICATIONS

William Strunk Jr., and E.B. White, The Elements of Style, 3rd Edition, 1979, all pages.*
(Continued)

*Primary Examiner* — Calvin Cheung
(74) *Attorney, Agent, or Firm* — Cantor Colburn LLP

(57) ABSTRACT

Sensing/control/identification devices for machines are provided. The devices include a first stage having a rectification and power conditioning module configured to receive electromagnetic (EM) transmissions via waveguide confinement and convert said EM transmissions to electrical power, a communication interface module configured to receive power from the rectification and conditioning module and at least one of receive or transmit EM transmissions/communications via waveguide confinement, and a control module configured to receive EM transmission data from the communication interface for processing and/or preparing EM communications for transmission. The devices further include a second stage having a tunable control module configured to process and convert instructions or commands (Continued)

from the control module of the first stage into analog or digital signals and generate and transmit an output signal. At least one connection is between the first stage and the second stage to enable communication between the first and second stages.

20 Claims, 6 Drawing Sheets

Related U.S. Application Data 20, 2015, Substitute for application No. 61/946,064, filed on Feb. 28, 2014.

(51) Int. Cl.

| | |
|---|---|
| *H01Q 5/55* | (2015.01) |
| *F01D 21/00* | (2006.01) |
| *H04L 12/24* | (2006.01) |
| *H04Q 1/28* | (2006.01) |
| *F02K 3/06* | (2006.01) |
| *G07C 5/00* | (2006.01) |
| *H04B 15/02* | (2006.01) |
| *H04W 12/04* | (2009.01) |
| *G01M 15/14* | (2006.01) |
| *H04B 1/02* | (2006.01) |
| *F02C 3/04* | (2006.01) |
| *F02C 9/00* | (2006.01) |
| *H01P 3/12* | (2006.01) |
| *H01P 5/02* | (2006.01) |
| *H05K 9/00* | (2006.01) |
| *H04L 12/40* | (2006.01) |
| *G06K 7/10* | (2006.01) |
| *G07C 5/08* | (2006.01) |
| *F02K 3/04* | (2006.01) |
| *H04B 1/3822* | (2015.01) |
| *H04L 29/08* | (2006.01) |
| *H04W 84/18* | (2009.01) |
| *H04W 84/12* | (2009.01) |

(52) U.S. Cl.
CPC .............. *F02K 3/04* (2013.01); *F02K 3/06* (2013.01); *G01M 15/14* (2013.01); *G06K 7/10188* (2013.01); *G07C 5/008* (2013.01); *G07C 5/0808* (2013.01); *H01P 3/122* (2013.01); *H01P 5/02* (2013.01); *H01Q 5/55* (2015.01); *H04B 1/02* (2013.01); *H04B 1/3822* (2013.01); *H04B 15/02* (2013.01); *H04B 15/025* (2013.01); *H04L 12/40045* (2013.01); *H04L 41/0803* (2013.01); *H04Q 1/28* (2013.01); *H04Q 9/00* (2013.01); *H04W 12/04* (2013.01); *H05K 9/0081* (2013.01); *F05D 2220/32* (2013.01); *F05D 2220/323* (2013.01); *F05D 2260/80* (2013.01); *F05D 2270/54* (2013.01); *F05D 2270/80* (2013.01); *H04L 67/10* (2013.01); *H04L 67/12* (2013.01); *H04L 2012/40273* (2013.01); *H04Q 2209/40* (2013.01); *H04W 84/12* (2013.01); *H04W 84/18* (2013.01)

(58) Field of Classification Search
CPC ....... H04W 84/18; H01Q 5/55; F01D 21/003; F02C 3/04; F02C 9/00; F02K 3/06; G01M 15/14; G06K 7/10188; G07C 5/008; G07C 5/0808; H01P 5/02; H04B 1/02; H04B 15/02; H04L 12/40045; H04L 41/0803; H04L 67/10; H04L 67/12; H04L 2012/40273; H05K 9/0081; F05D 2220/32; F05D 2220/323; F05D 2260/80; F05D 2270/54; F05D 2270/80
See application file for complete search history.

(56) References Cited

U.S. PATENT DOCUMENTS

| | | |
|---|---|---|
| 9,685,299 B2 | 6/2017 | Nakagawa |
| 2005/0040934 A1 | 2/2005 | Shanton |
| 2007/0108770 A1* | 5/2007 | Riesberg .................. F03G 7/08 290/44 |
| 2008/0055047 A1 | 3/2008 | Osada et al. |
| 2010/0219942 A1 | 9/2010 | Lee |
| 2010/0231407 A1 | 9/2010 | Carr |
| 2011/0309937 A1 | 12/2011 | Bunza et al. |
| 2012/0121383 A1 | 5/2012 | Michligk |
| 2013/0306737 A1 | 11/2013 | Freeman |
| 2014/0052410 A1 | 2/2014 | Tralshawala et al. |
| 2016/0118703 A1 | 4/2016 | Hejase et al. |
| 2016/0209264 A1 | 7/2016 | Berkcan et al. |

FOREIGN PATENT DOCUMENTS

| | | |
|---|---|---|
| EP | 2927648 A1 | 10/2007 |
| EP | 2154552 A1 | 2/2010 |
| EP | 2913808 A1 | 9/2015 |
| EP | 2961087 | 12/2015 |
| GB | 886127 A | 1/1962 |
| WO | 0116554 A2 | 3/2001 |
| WO | 2005096571 A1 | 10/2005 |
| WO | 2014121338 A1 | 8/2014 |
| WO | 2014121402 A1 | 8/2014 |
| WO | 2015073852 A1 | 5/2015 |
| WO | 2015130563 A1 | 9/2015 |
| WO | 2016034773 A1 | 3/2016 |

OTHER PUBLICATIONS

European Search Report, European Application No. 17188875.3, Date of Mailing Jan. 30, 2018, European Jatent Office; European Search Report 5 pages.

Lee J W, et al., "A Technique to build a secret key in integrated circuits for identification and authentication applications", Symposium on VLSI Circuits Digest of Technical Papers, Jun. 17, 2004, pp. 176-179, XP-002420397.

Ranasinghe D C et al., "Security and Privacy Solutions for Low-Cost RFID Systems", ISSNIP-IEEE, Dec. 14, 2004, pp. 337-342, DOI 10.1109/ISSNIP.2004.1417485.

* cited by examiner

MULTI-STAGE SENSING/CONTROL/IDENTIFICATION DEVICE HAVING PROTECTED COMMUNICATION AND REMOTE POWER

CROSS-REFERENCE TO RELATED APPLICATIONS

This Application is a continuation-in-part of U.S. patent application Ser. No. 15/114,234 filed on Jul. 26, 2016, which is a U.S. National Stage of Application No. PCT/US2015/016761 filed on Feb. 20, 2015, which claims the benefit of U.S. Provisional Patent Application No. 61/946,064 filed on Feb. 28, 2014, the contents of each of these applications are incorporated herein by reference thereto.

BACKGROUND

This disclosure relates to electromagnetic communication, and more particularly to multi-stage sensing, control, and identification devices having protected communication and remote power.

A gas turbine engine typically includes a fan section, a compressor section, a combustor section and a turbine section. Air entering the compressor section is compressed and delivered into the combustor section where it is mixed with fuel and ignited to generate a high-speed exhaust gas flow. The high-speed exhaust gas flow expands through the turbine section to drive the compressor and the fan section. The compressor section typically includes low and high pressure compressors, and the turbine section includes low and high pressure turbines.

Detailed knowledge of gas turbine engine and other machinery operation for control or health monitoring requires sensing systems that need information from locations that are sometimes difficult to access due to moving parts, internal operating environment or machine configuration. The access limitations make wire routing bulky, expensive, and vulnerable to interconnect failures. The sensor and interconnect operating environments for desired sensor locations often exceed the capability of the interconnect systems. In some cases, cable cost, volume, and weight exceed the desired limits for practical applications.

Application of electromagnetic sensor technologies to address the wiring constraints faces the challenge of providing reliable communications in a potentially unknown environment with potential interference from internal or external sources.

BRIEF DESCRIPTION

In an embodiment, sensing/control/identification devices of machines are provided. The device has a rectification and power conditioning module configured to receive electromagnetic (EM) transmissions from an EM transmitting source via waveguide confinement and convert said EM transmissions to electrical power, a communication interface module configured to receive power from the rectification and power conditioning module and at least one of receive the EM transmissions or transmit EM communications via waveguide confinement, and a control module configured to receive EM transmission data from the communication interface for processing or preparing the EM communications for transmission from the communication interface module. A second stage of the device includes a tunable control module configured to process and convert instructions or commands from the control module of the first stage into analog or digital signals and generate and transmit an output signal. At least one connection is between the first stage and the second stage to enable communication between the first stage and the second stage.

In addition to one or more of the features described above, or as an alternative to any of the foregoing embodiments, further embodiments of the device may include, the first stage further comprising a storage module, wherein the control module is configured to at least one of read from or write to the storage module.

In addition to one or more of the features described above, or as an alternative to any of the foregoing embodiments, further embodiments of the device may include that the storage module includes at least one of (i) programs and/or applications to be executed by the control module, (ii) identification data associated with the device, (iii) historical data associated with the device, (iv) characterization curves associated with the machine, (v) an engine installation, (vi) flight profiles, (vii) environmental data, or (viii) baseline fluid characteristics.

In addition to one or more of the features described above, or as an alternative to any of the foregoing embodiments, further embodiments of the device may include, the second stage further comprising a sensor circuit module configured to interface between a hardware device and the second stage.

In addition to one or more of the features described above, or as an alternative to any of the foregoing embodiments, further embodiments of the device may include, the second stage further comprising a conversion module configured to convert a signal from the hardware device to a signal to be processed by the control module of the first stage.

In addition to one or more of the features described above, or as an alternative to any of the foregoing embodiments, further embodiments of the device may include that the rectification and power conditioning module, the communication interface module, the control module, a conversion module, and a sensor circuit module are all configured on a single printed circuit board or a highly integrated circuit such as a system in a package (SiP).

In addition to one or more of the features described above, or as an alternative to any of the foregoing embodiments, further embodiments of the device may include that the first stage and the second stage are contained within a network of shielded components to mitigate unwanted electromagnetic energy from exiting or entering the network, said shielded components in waveguide communication.

According to another embodiment, systems for a gas turbine engines are provided. The systems include a component, a hardware device operably connected to the component and configured to measure a characteristic of the component, an electromagnetic (EM) transmitting source located remote from the component, and a sensing/control/identification device configured on or proximate to the component. The sensing/control/identification device includes a first stage and a second stage. The first stage has a rectification and power conditioning module configured to receive electromagnetic (EM) transmissions from an EM transmitting source via waveguide confinement and convert said EM transmissions to electrical power, a communication interface module configured to receive power from the rectification and power conditioning module and at least one of receive the EM transmissions or transmit EM communications via waveguide confinement, and a control module configured to receive EM transmission data from the communication interface for processing or preparing the EM communications for transmission from the communication interface module. The second stage has a tunable control module configured to process and convert instructions or commands from the control module of the first stage into analog or digital signals and generate and transmit an output signal. At least one connection is between the first stage and the second stage to enable communication between the first stage and the second stage.

In addition to one or more of the features described above, or as an alternative to any of the foregoing embodiments, further embodiments of the system may include, the first stage further comprising a storage module, wherein the control module is configured to at least one of read from or write to the storage module.

In addition to one or more of the features described above, or as an alternative to any of the foregoing embodiments, further embodiments of the system may include that the storage module includes at least one of (i) programs and/or applications to be executed by the control module, (ii) identification data associated with the device, (iii) historical data associated with the device, (iv) characterization curves associated with the machine, (v) an engine installation, (vi) flight profiles, (vii) environmental data, or (viii) baseline fluid characteristics.

In addition to one or more of the features described above, or as an alternative to any of the foregoing embodiments, further embodiments of the system may include, the second stage further comprising a sensor circuit module configured to interface between the hardware device and the second stage.

In addition to one or more of the features described above, or as an alternative to any of the foregoing embodiments, further embodiments of the system may include, the second stage further comprising a conversion module configured to convert a signal from the hardware device to a signal to be processed by the control module of the first stage.

In addition to one or more of the features described above, or as an alternative to any of the foregoing embodiments, further embodiments of the system may include that the rectification and power conditioning module, the communication interface module, the control module, a conversion module, and a sensor circuit module are all configured on a single printed circuit board or a highly integrated circuit such as a system in a package (SiP).

In addition to one or more of the features described above, or as an alternative to any of the foregoing embodiments, further embodiments of the system may include that the hardware device includes a measurement cavity and wherein the tunable control module is configured to output a signal tuned to the measurement cavity.

In addition to one or more of the features described above, or as an alternative to any of the foregoing embodiments, further embodiments of the system may include that the hardware device is a sensing element communicably attached to a flow path, the sensing element configured to measure a characteristic of a fluid within the flow path.

In addition to one or more of the features described above, or as an alternative to any of the foregoing embodiments, further embodiments of the system may include that the tunable control module is configured to output a signal tuned to the fluid within the flow path.

In addition to one or more of the features described above, or as an alternative to any of the foregoing embodiments, further embodiments of the system may include a plurality of hardware elements, wherein the tunable control module is configured to communicate with each of the plurality of hardware elements.

In addition to one or more of the features described above, or as an alternative to any of the foregoing embodiments, further embodiments of the system may include that the component is at least one of a compressor vane segment or a component in the gas turbine engine that requires control or monitoring functions.

In addition to one or more of the features described above, or as an alternative to any of the foregoing embodiments, further embodiments of the system may include that the first stage and the second stage are contained within a network of shielded components to mitigate unwanted electromagnetic energy from exiting or entering the network, said shielded components in waveguide communication.

In addition to one or more of the features described above, or as an alternative to any of the foregoing embodiments, further embodiments of the system may include that the control/sensing/identification device is contained within a network of shielded components in waveguide communication to mitigate unwanted electromagnetic energy from exiting or entering the network.

BRIEF DESCRIPTION OF THE DRAWINGS

The subject matter which is regarded as the present disclosure is particularly pointed out and distinctly claimed in the claims at the conclusion of the specification. The foregoing and other features, and advantages of the present disclosure are apparent from the following detailed description taken in conjunction with the accompanying drawings in which:

DETAILED DESCRIPTION

Figure 1:
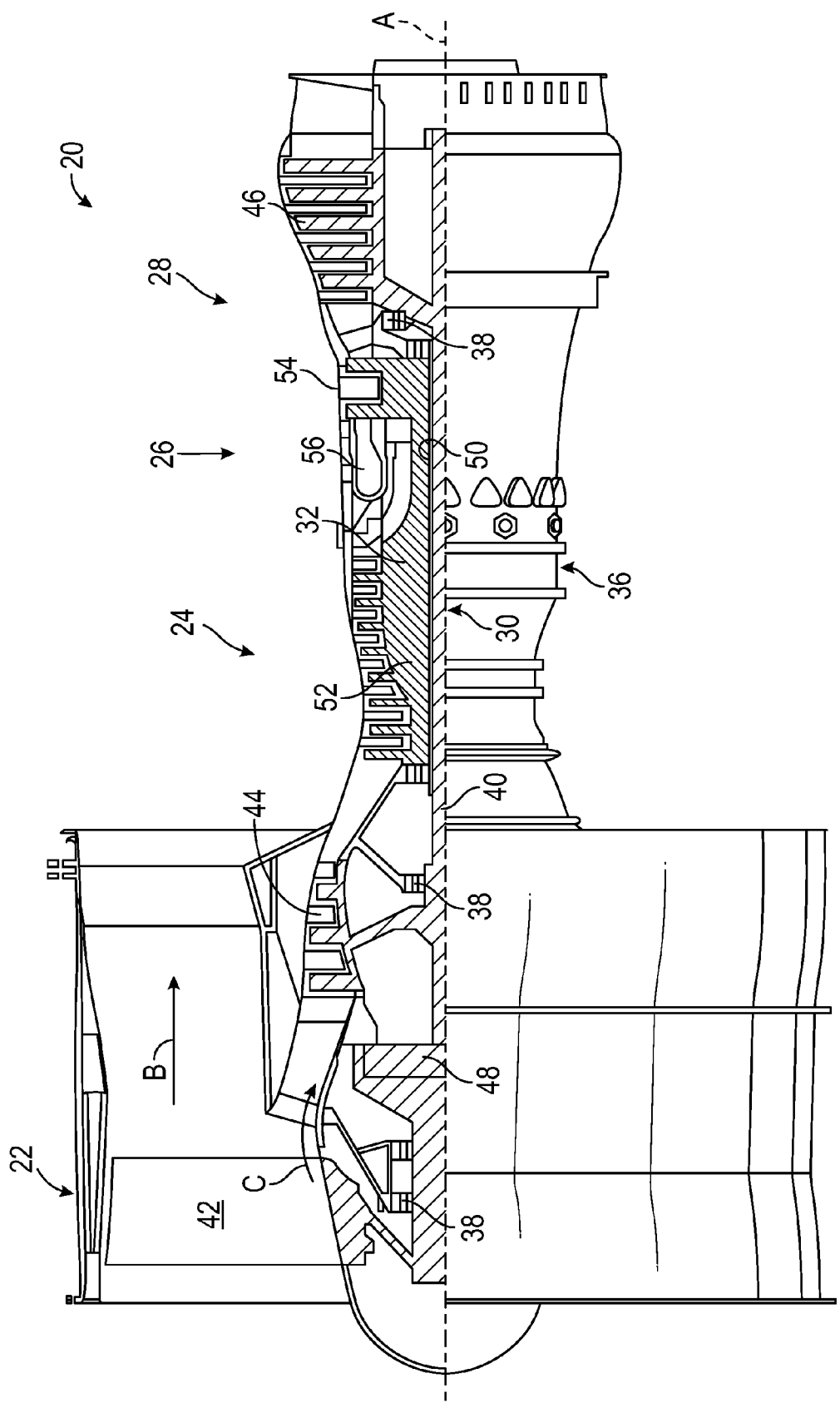
FIG. 1 is a cross-sectional view of a gas turbine engine.

Various embodiments of the present disclosure are related to electromagnetic communication in a machine. FIG. 1 schematically illustrates a gas turbine engine 20 as one example of a machine as further described herein. The gas turbine engine 20 is depicted as a two-spool turbofan that generally incorporates a fan section 22, a compressor section 24, a combustor section 26 and a turbine section 28. Alternative engines may include an augmentor section (not shown) among other systems or features. The fan section 22 drives air along a bypass flow path B in a bypass duct to provide a majority of the thrust, while the compressor section 24 drives air along a core flow path C for compression and communication into the combustor section 26 then expansion through the turbine section 28. Although depicted as a two-spool turbofan gas turbine engine in the disclosed non-limiting embodiment, it should be understood that the concepts described herein are not limited to use with two-spool turbofans as the teachings may be applied to other types of turbine engines including three-spool architectures or any other machine that requires sensors to operate with similar environmental challenges or constraints. Additionally, the concepts described herein may be applied to any machine or system comprised of control and/or health monitoring systems.

The exemplary engine 20 generally includes a low speed spool 30 and a high speed spool 32 mounted for rotation about an engine central longitudinal axis A relative to an engine static structure 36 via several bearing systems 38. It should be understood that various bearing systems 38 at various locations may alternatively or additionally be provided, and the location of bearing systems 38 may be varied as appropriate to the application.

The low speed spool 30 generally includes an inner shaft 40 that interconnects a fan 42, a first (or low) pressure compressor 44 and a first (or low) pressure turbine 46. The inner shaft 40 is connected to the fan 42 through a speed change mechanism, which in exemplary gas turbine engine 20 is illustrated as a geared architecture 48 to drive the fan 42 at a lower speed than the low speed spool 30. The high speed spool 32 includes an outer shaft 50 that interconnects a second (or high) pressure compressor 52 and a second (or high) pressure turbine 54. A combustor 56 is arranged in exemplary gas turbine engine 20 between the high pressure compressor 52 and the high pressure turbine 54. A mid-turbine frame 58 of the engine static structure 36 is arranged generally between the high pressure turbine 54 and the low pressure turbine 46. The mid-turbine frame 58 further supports bearing systems 38 in the turbine section 28. The inner shaft 40 and the outer shaft 50 are concentric and rotate via bearing systems 38 about the engine central longitudinal axis A which is collinear with their longitudinal axes.

The core airflow is compressed by the low pressure compressor 44 then the high pressure compressor 52, mixed and burned with fuel in the combustor 56, then expanded over the high pressure turbine 54 and low pressure turbine 46. The mid-turbine frame 58 includes airfoils 60 which are in the core airflow path C. The turbines 46, 54 rotationally drive the respective low speed spool 30 and high speed spool 32 in response to the expansion. It will be appreciated that each of the positions of the fan section 22, compressor section 24, combustor section 26, turbine section 28, and fan drive gear system 48 may be varied. For example, gear system 48 may be located aft of combustor section 26 or even aft of turbine section 28, and fan section 22 may be positioned forward or aft of the location of gear system 48.

The engine 20 in one example is a high-bypass geared aircraft engine. In a further example, the engine 20 bypass ratio is greater than about six (6), with an example embodiment being greater than about ten (10), the geared architecture 48 is an epicyclic gear train, such as a planetary gear system or other gear system, with a gear reduction ratio of greater than about 2.3 and the low pressure turbine 46 has a pressure ratio that is greater than about five. In one disclosed embodiment, the engine 20 bypass ratio is greater than about ten (10:1), the fan diameter is significantly larger than that of the low pressure compressor 44, and the low pressure turbine 46 has a pressure ratio that is greater than about five 5:1. Low pressure turbine 46 pressure ratio is pressure measured prior to inlet of low pressure turbine 46 as related to the pressure at the outlet of the low pressure turbine 46 prior to an exhaust nozzle. The geared architecture 48 may be an epicycle gear train, such as a planetary gear system or other gear system, with a gear reduction ratio of greater than about 2.3:1. It should be understood, however, that the above parameters are only exemplary of one embodiment of a geared architecture engine and that the present invention is applicable to other gas turbine engines including direct drive turbofans.

A significant amount of thrust is provided by the bypass flow B due to the high bypass ratio. The fan section 22 of the engine 20 is designed for a particular flight condition—typically cruise at about 0.8 Mach and about 35,000 feet (10.67 km). The flight condition of 0.8 Mach and 35,000 ft (10.67 km), with the engine at its best fuel consumption—also known as "bucket cruise Thrust Specific Fuel Consumption ('TSFC')"—is the industry standard parameter of lbm of fuel being burned divided by lbf of thrust the engine produces at that minimum point. "Low fan pressure ratio" is the pressure ratio across the fan blade alone, without a Fan Exit Guide Vane ("FEGV") system. The low fan pressure ratio as disclosed herein according to one non-limiting embodiment is less than about 1.45. "Low corrected fan tip speed" is the actual fan tip speed in ft/sec divided by an industry standard temperature correction of $[(Tram\ °\ R)/(518.7°\ R)]0.5$. The "Low corrected fan tip speed" as disclosed herein according to one non-limiting embodiment is less than about 1150 ft/second (350 m/second).

The example gas turbine engine includes the fan 42 that comprises in one non-limiting embodiment less than about twenty-six (26) fan blades. In another non-limiting embodiment, the fan section 22 includes less than about twenty (20) fan blades. Moreover, in one disclosed embodiment the low pressure turbine 46 includes no more than about six (6) turbine rotors schematically indicated at 34. In another non-limiting example embodiment the low pressure turbine 46 includes about three (3) turbine rotors. A ratio between the number of fan blades 42 and the number of low pressure turbine rotors is between about 3.3 and about 8.6. The example low pressure turbine 46 provides the driving power to rotate the fan section 22 and therefore the relationship between the number of turbine rotors 34 in the low pressure turbine 46 and the number of blades 42 in the fan section 22 disclose an example gas turbine engine 20 with increased power transfer efficiency.

Figure 2:
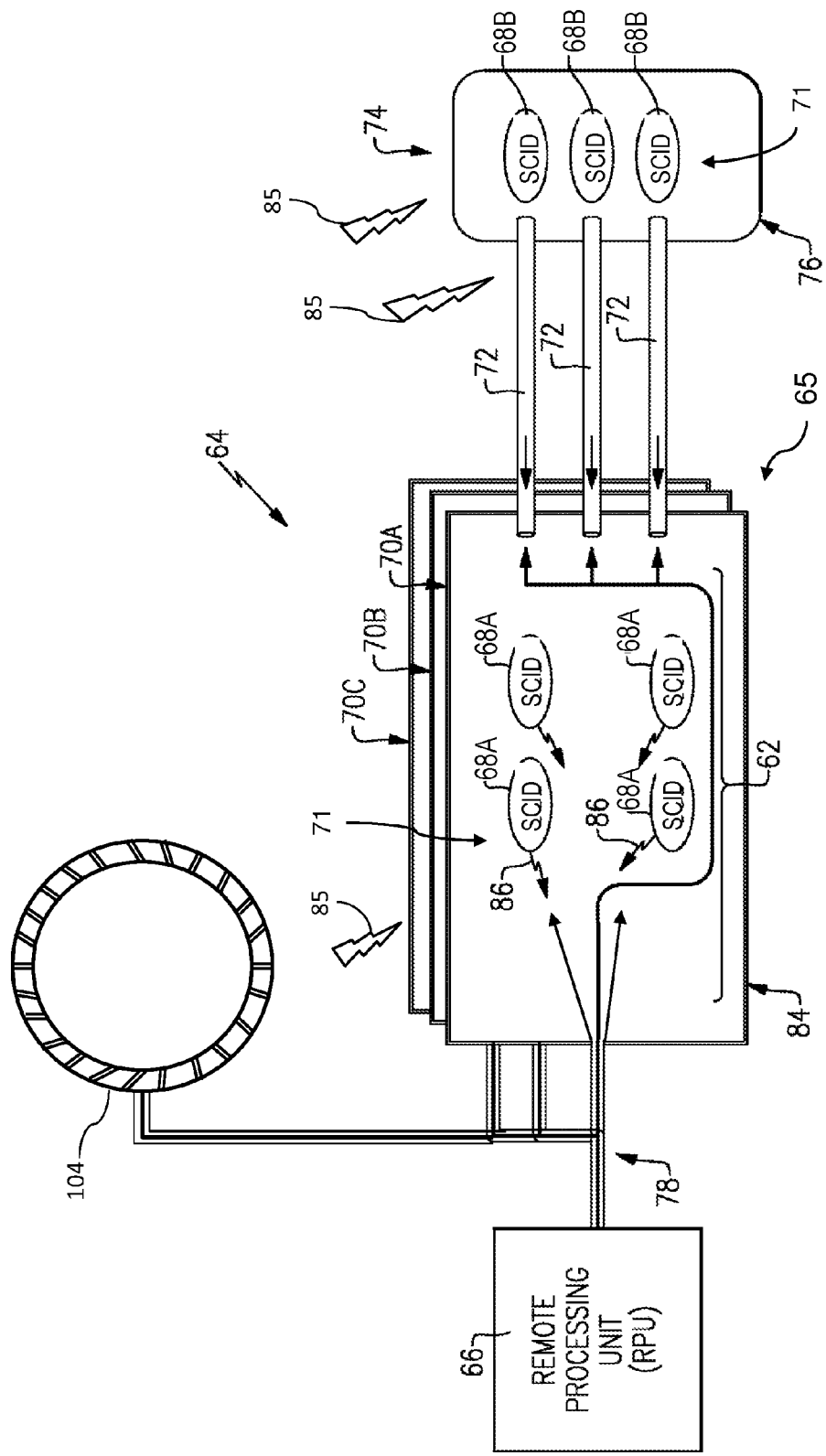
FIG. 2 is a schematic view of an example control and health monitoring system including a shielded electromagnetic network in accordance with an embodiment of the disclosure.

The disclosed example gas turbine engine 20 includes a control and health monitoring system 64 (generally referred to as system 64) utilized to monitor component performance and function. In this example, a sensing/control/identification device (SCID) 68A is located within a sub-system component (SSC) 70. The SCID 68A communicates with electromagnetic energy to a remote processing unit (RPU) 66 through a path comprised of a transmission path 78 and a path 62 within a SSC 70 as best seen in FIG. 2. The path may also be extended along one or more shielded paths 72 to remote SCIDs 68B in separate SSCs 74 (FIG. 2). This entire path (e.g., transmission path 78, path 62, and shielded paths 72) comprises a shielded electromagnetic network (SEN) 65. The RPU 66 may transmit signals to a network 71 of the SCID 68A, 68B (FIG. 2) and/or receive information indicative of current operation of the component being monitored. The transmission media for any portion of the SEN 65 may include solid, liquid, or gaseous material. In this example, a pressure internal to the SSC 70 is monitored and that information transmitted through the path 62 of the SEN 65 to the RPU 66 for use in controlling engine operation or monitoring component health. However, it should be understood that it is within the contemplation of this disclosure that the disclosed system 64 may be utilized to control and/or monitor any component function or characteristic of a turbomachine or aircraft component operation and/or other machines.

Prior control & diagnostic system architectures utilized in various applications include centralized system architecture in which the processing functions reside in an electronic control module. Redundancy to accommodate failures and continue system operation systems are provided with dual channels with functionality replicated in both control channels. Actuator and sensor communication is accomplished through analog wiring for power, command, position feedback, sensor excitation and sensor signals. Cables and connections include shielding to minimize effects caused by electromagnetic interference (EMI). The use of analog wiring and the required connections limits application and capability of such systems due to the ability to locate wires, connectors, and electronics in small and harsh environments that experience extremes in temperature, pressure, and/or vibration.

Referring to FIG. 2, system 64 includes SEN 65 installed near, in, or on each of several SSCs 70A-C, as examples of the SSC 70 of FIG. 1. Each of the SSCs 70A-C may be an engine component, actuator, or any other machine part from which information and communication is performed for monitoring and/or control purposes. In this example, each of the SSCs 70A-C includes a path 62 of the SEN 65 that is the primary means of communicating with one or multiple features of the particular SSC 70A-C or remotely located SSCs 74. The remotely located SSCs 74 may contain a single or multiple electronic circuits or sensors configured to communicate over the SEN 65.

The RPU 66 sends and receives power and data to and from the SSCs 70A-C and may also provide a communication link between different SSCs 70A-C. The RPU 66 may be located on equipment near other system components or located remotely as desired to meet application requirements.

A transmission path (TP) 78 between the RPU 66 and SSCs 70A-C is used to send and receive data routed through the RPU 66 from a control module or other components. The TP 78 may utilize electrical wire, optic fiber, waveguide, or any other electromagnetic communication including radio frequency/microwave electromagnetic energy, visible, or non-visible light. The interface between the TP 78 and SSC 70A-C transmits power and signals received through the TP 78 to one or multiple SCIDs 68A in the example SSC 70A.

The example SCIDs 68A, 68B may be radio-frequency identification (RFID) devices that include processing, memory, and/or the ability to connect to conventional sensors or effectors such as solenoids or electro-hydraulic servo valves. The SSC 70A may contain radio frequency (R/F) antennas, magnetic devices, or optic paths designed to be powered and/or communicate to and/or from the TP 78 paths. The SSCs 70A-C may also use shielded paths 72 that can be configured as any type of electromagnetic communication, including, for instance, radio frequency, microwaves, magnetic, or optic waveguide transmission to the SCIDs 68B located within the remotely located SSCs 74.

Shielding 84 within and around the SSC 70A is provided such that electromagnetic energy or light interference 85 with electromagnetic signals 86 (shown schematically as arrows) within the SSC 70A are mitigated. Moreover, the shielding 84 provides that the signals 86 are less likely to propagate into the environment outside the SSC 70A and enable unauthorized access to information. Similarly, remotely located SSCs 74 can each include respective shielding 76 to limit signal propagation to shielded paths 72.

In some embodiments, confined electromagnetic radiation is in the range 1-100 GHz. Electromagnetic radiation can be more tightly confined around specific carrier frequencies, such as 3-4.5 GHz, 24 GHz, 60 GHz, or 76-77 GHz as examples in the microwave spectrum. A carrier frequency can transmit electric power, as well as communicate information, to multiple SCIDs 68A, 68B using various modulation and signaling techniques.

RFID, electromagnetic, or optical devices implemented as the SCIDs 68A, 68B can provide information indicative of a physical parameter, such as pressure, temperature, speed, proximity, vibration, identification, and/or other parameters used for identifying, monitoring, and/or controlling component operation. The SCIDs 68A, 68B may also include control devices such as a solenoid, switch, or other physical actuation devices. Signals communicated over the TP 78 may employ techniques such as checksums, hash algorithms, shielding, and/or encryption to mitigate cyber security threats and interference.

The disclosed system 64 containing the SEN 65 (e.g., transmission path 78, path 62, and shielded paths 72) provides a communication link between the RPU 66 and multiple SSCs 70A-C, 74. The shielding 84, 76 can be provided along the transmission path 78 and for each SSC 70A-C and 74 such that power and communication signals are shielded from outside interference, which may be caused by environmental electromagnetic or optic interference. Moreover, the shielding 84, 76 prevents intentional interference 85 with communication at each component. Intentional interference 85 may take the form of unauthorized data capture, data insertion, general disruption, and/or any other action that degrades system communication. Environmental sources of interference 85 may originate from noise generated from proximate electrical systems in other components or machinery along with electrostatic fields, and/or any broadcast signals from transmitters or receivers. Additionally, pure environmental phenomena, such as cosmic radio frequency radiation, lightning, or other atmospheric effects could interfere with local electromagnetic communications. Accordingly, the individualized shielding 84, 76 for each of the SSCs 70A-C and 74 prevent the undesired interference with communication. The shielding 84, 76 may be applied to enclosed or semi-enclosed volumes that contain the SCIDs 68.

It should be appreciated that while the system 64 is explained by way of example with regard to a gas turbine engine 20, other machines and machine designs can be modified to incorporate built-in shielding for each monitored or controlled components to enable the use of a SEN. For example, the system 64 can be incorporated in a variety of harsh environment machines, such as an elevator system, heating, ventilation, and air conditioning (HVAC) systems, manufacturing and processing equipment, a vehicle system, an environmental control system, and all the like. The disclosed system 64 includes the SEN 65 that enables consistent communication with electromagnetic devices, such as the example SCIDs 68A, 68B, and removes variables encountered with electromagnetic communications such as distance between transmitters and receiving devices, physical geometry in the field of transmission, control over transmission media such as air or fluids, control over air or fluid contamination through the use of filtering, or isolation and knowledge of temperature and pressure.

The system 64 provides for localized transmission to SCIDs 68A, 68B such that power requirements are reduced. Localized transmission occurs within a shielded volume of each SSC 70A-C, 74 that is designed specifically to accommodate reliable electromagnetic transmission for the application specific environment and configuration. Shielding of localized components is provided such that electromagnetic signals are contained within the shielding 84 for a specific instance of the SSC 70A-C. The system 64 therefore enables communication with one or multiple SCIDs 68 simultaneously. The example RPU 66 enables sending and receiving of power and data between several different SSCs 70A-C and 74. The RPU 66 may be located on the equipment near other system components or located away from the machinery for any number of reasons.

The system 64 provides for a reduction in cable and interconnecting systems to reduce cost and increases reliability by reducing the number of physical interconnections. Reductions in cable and connecting systems further provides for a reduction in weight while enabling additional redundancy without significantly increasing cost. Moreover, additional sensors can be added without the need for additional wiring and connections that provide for increased system accuracy and response. Finally, the embodiments enable a "plug-n-play" approach to add a new SCID, potentially without a requalification of the entire system but only the new component; thereby greatly reducing qualification costs and time.

The TP 78 between the RPU 66 and the SSCs 70A-C utilized to send and receive data from other components may take multiple forms such as electrical wire, optic fiber, radio frequency signals or energy within the visible or non-visible light spectrum. The numerous options for a communication path of the TP 78 enable additional design flexibility. The TP 78 transfers energy to the SSC 70A-C such that one or multiple SCIDs 68A, 68B can be multiplexed over one TP 78 to the RPU 66.

SCIDs 68A, 68B can include RFID devices that may or may not include processing, memory, and/or the ability to connect to conventional sensors. Radio frequency (R/F) antennas, magnetic devices, or optic paths within the SSCs 70A-C may be designed to communicate with one or multiple SCIDs 68A, 68B. Moreover, R/F, microwave, magnetic, or optic waveguide transmission paths 72 can be utilized to communicate with individual electromagnetic devices remotely located from the SSC 70A-C.

Shielding 84, 76 within and around the SSC 70A-C, 74 substantially prevents electromagnetic energy or light interference with signals and also makes it less likely that signals can propagate into the surrounding environment to prevent unauthorized access to information.

According to embodiments, electromagnetic (EM) communication with the system 64 can be performed through multi-material and functional/structural components including, for instance, fuel, oil, engineered dielectrics, and enclosed free spaces. By forming waveguides through existing machine components and using electromagnetic communication for one or more of the TP 78, path 62, and/or shielded paths 72, system contaminants and waveguide size for given frequencies can be reduced.

In embodiments, existing components of the gas turbine engine 20 of FIG. 1 can be used to act as waveguides filled with air, fluids, or a specifically implemented dielectric to transmit EM energy for writing and reading to/from EM devices in a Faraday cage protected environment. Use of existing structure can allow waveguide channels to be built in at the time of manufacture by machining passages or additively manufacturing waveguide channels as communication paths. For example, communication paths can be built into the structure of SSCs 70A-C and 74 to guide EM energy through each component. The SSCs 70A-C and 74 may contain gas such as air at atmospheric pressure or any other level, or liquids such as oil or fuel. In any part of the system 64, a dielectric may be employed to resist contamination or to reduce requirements for waveguide dimensions.

Figure 3:
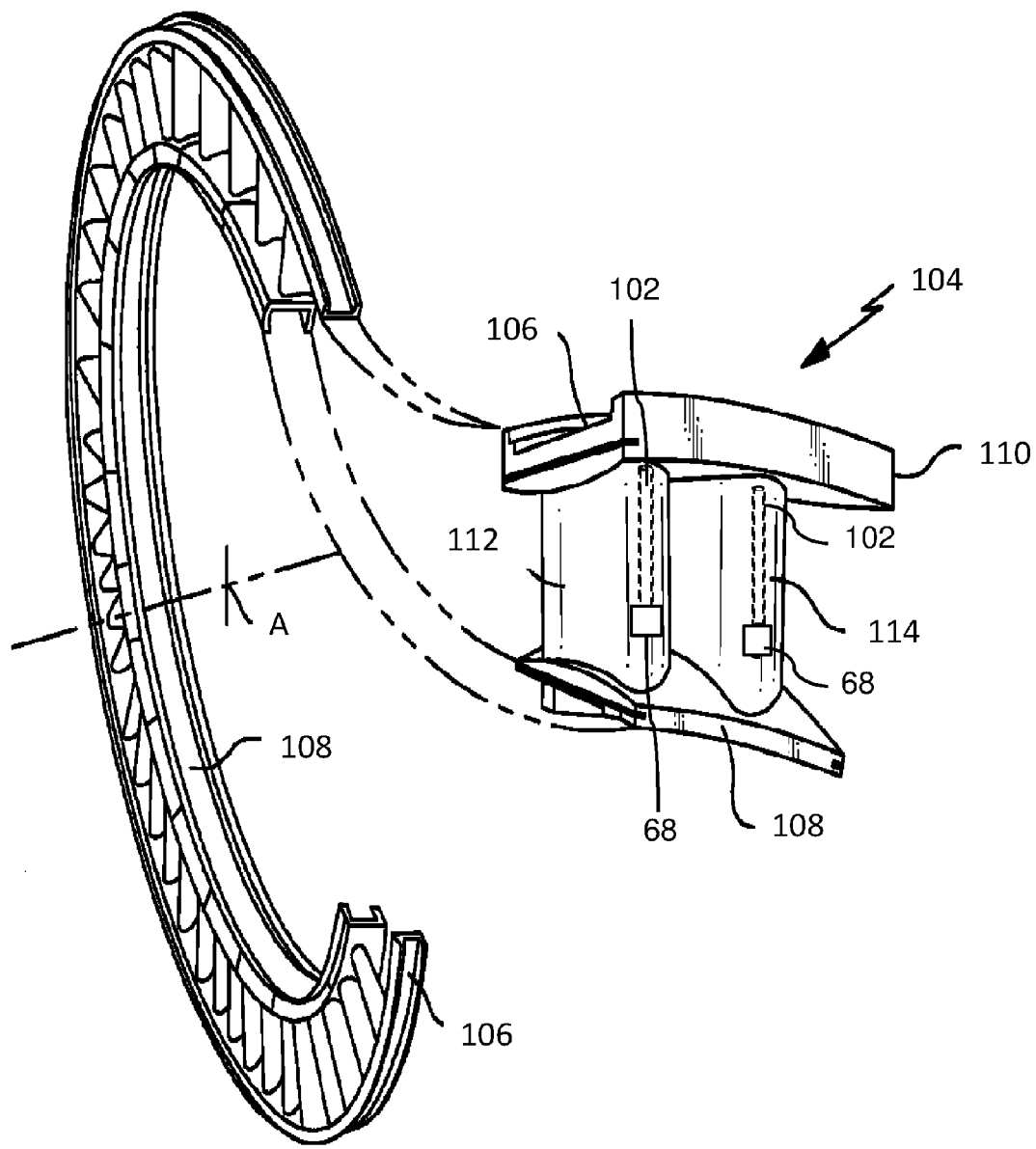
FIG. 3 is a schematic view of a communication path through a component in accordance with an embodiment of the disclosure.

Various machine components may also be used for transmission if the proper waveguide geometry is designed into the component, which can also provide functional and structural aspects of the machine. Examples, such as machine housings, fluid (including air) fill tubes, hydraulic lines, support frames and members, internal machine parts and moving parts that can be coupled to or shaped into waveguide geometry may also be incorporated in embodiments. As one example, FIGS. 2 and 3 depict a plurality of compressor vane segments 104 of the compressor section 24 of FIG. 1 that incorporate one or more communication paths 102 integrally formed in/on a component of the gas turbine engine 20 of FIG. 1. Each communication path 102 can route a portion of electromagnetic signals communicated from the TP 78 to one or more of the SCIDs 68 of FIG. 3. Each communication path 102 also provides a potentially alternate route in which the electromagnetic signal can be channeled in the event of a line or linkage failure, thereby building in inherent redundancy and system level robustness.

In the example of FIG. 3, a compressor vane segment 104 includes an arcuate outer vane platform segment 106 and an arcuate inner vane platform segment 108 radially spaced apart from each other. The arcuate outer vane platform segment 106 may form an outer portion and the arcuate inner vane platform segment 108 may form an inner portion to at least partially define an annular compressor vane flow path.

Communication path 102 in a vane 112 can be formed during a manufacturing process to directly carry electromagnetic signaling of the TP 78 through a component of the gas turbine engine 20 of FIG. 1 directly to a SCID 68 depicted in FIG. 3. Communication path 102 can also terminate with SCIDs 68 to read pressures, temperatures, or other parameters at the end of the TP 78 or 72. Waveguide usage can enable very low transmission losses such that the RPU 66 of FIG. 2 can be physically located much farther away from the SCIDs 68A, 68B of FIG. 2 than conventional free space transmitting devices. Use of a dielectric in the waveguides can reduce the dimensional requirements for the waveguides and resist contaminants, such as moisture, particles, gases, corrosion, and/or liquids that may increase transmission losses. Embodiments can use fluids in existing systems to act as a dielectric, particularly fluids with a dielectric constant that approaches or is better than free space. Thus, existing fuel or oil lines of the gas turbine engine 20 of FIG. 1 may be used as waveguides if they have appropriate dielectric properties.

Figure 4:
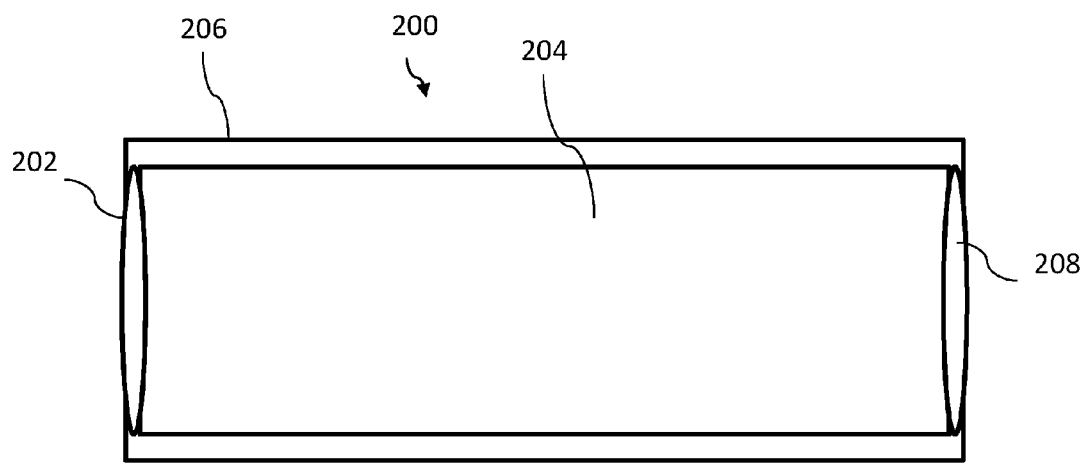
FIG. 4 is a schematic view of a waveguide in accordance with an embodiment of the disclosure.

Further embodiments include allowing transition of EM energy from a waveguide into a free space environment. Some of the SSCs 70A-C, 74 of FIG. 2 have multiple SCIDs 68A, 68B that reside in a protected Faraday cage (e.g., a shielded volume within shielding 84, 76) filled with air or other fluids. Transitioning energy from a waveguide to and from an open cavity is required to prevent unwanted signal loss. Embodiments transition EM energy from TP 78 into a free space environment containing either air or a fluid within shielding 84 of SSC 70A of FIG. 2 using an example waveguide 200 of FIG. 4. The waveguide 200 may be an embodiment of the TP 78 or the shielded path 72 of FIG. 2. In some embodiments, EM energy transitions through multiple interfaces having different environmental characteristics, such as waveguide 250 of FIG. 5 as a further example of the shielded path 72 of FIG. 2. Waveguides 200, 250 can connect multiple SCIDs 68 and may pass through existing components, for instance, in communication path 102 of FIG. 3, to facilitate transmission of EM power and signaling between devices. The waveguides 200, 250 may incorporate "T"s, "Y"s, splitters or other branching types to facilitate a network topology.

EM energy may be confined to a waveguide, or alternatively can be transmitted through a combination of waveguide and free space communications in a shielded environment, e.g., within shielding 84, 76 of FIG. 2, to meet system requirements for signal attenuation and disturbances. Waveguide 200 of FIG. 4 can include a waveguide transmitter interface 202 that enables electromagnetic signal transmission within a waveguide medium or electromagnetic window 204 in a guidance structure 206 to a waveguide transition interface 208. The waveguide transmitter interface 202 may be an EM energy emitter, and the waveguide transition interface 208 may be operable to pass the EM energy through shaping, an antenna structure, or an active structure to a confined free space within shielding 84, 76 of FIG. 2. The waveguide medium 204 can be a gas or liquid, such as air, oil, fuel, solid dielectric, or the like. In some embodiments, the waveguide medium 204 is a dielectric. The guidance structure 206 can be a metal tube and may be integrally formed on/within a component of the gas turbine engine 20 of FIG. 1, such as communication path 102 of FIG. 3. In other embodiments, the guidance structure 206 is an outer edge of a dielectric and need not include a metallic structure. Although depicted as a single straight path, it will be understood that the waveguide 200 can bend and branch to reach multiple SCIDs 68A, 68B of FIG. 2. In other embodiments, the waveguide 200 may take the form of a planer stripline, trace on a printed circuit board, or via within a highly integrated System in a Package (SiP).

Figure 5:
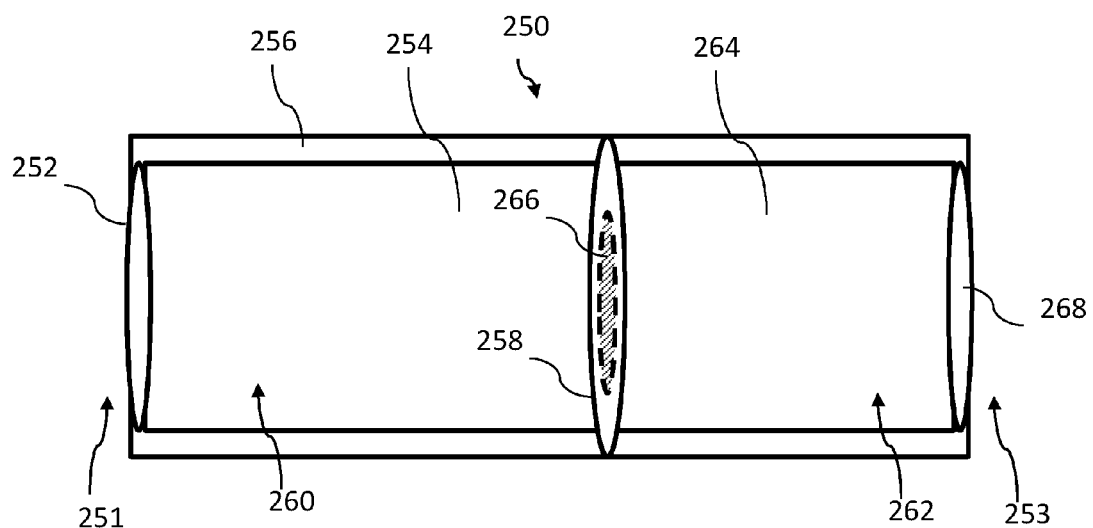
FIG. 5 is a schematic view of another waveguide in accordance with an embodiment of the disclosure.

Transitioning EM energy from a waveguide to and from cavities using TP 78 and/or shielded paths 72 can present a challenge when SCIDs 68A, 68B of FIG. 2 are located in higher temperature or pressure environments, especially in environments containing fuel, oil, flammable liquids, or associated vapors. With further reference to FIG. 5, the waveguide 250 enables transitioning of EM energy from a first environment 251 into a second environment 253 with a higher temperature and/or higher pressure capable barrier against fluids or gasses. Waveguide 250 of FIG. 5 can include a waveguide transmitter interface 252 that enables electromagnetic signal transmission within a guidance structure 256 to a waveguide transition interface 258. The waveguide transmitter interface 252 may be an EM energy emitter in the first environment 251. The waveguide transition interface 258 may be operable to pass the EM energy through shaping, an antenna structure, or an active structure from a first portion 260 of the waveguide 250 to a second portion 262 of the waveguide 250. The first portion 260 of the waveguide 250 may have a first waveguide medium 254 that is different from a second waveguide medium 264 of the second portion 262. A transition window 266 can be incorporated in the waveguide transition interface 258 as a dielectric or thin metal EM window operable to pass a frequency range of interest between the first portion 260 and the second portion 262 of the waveguide 250. The second portion 262 of the waveguide 250 can also include a secondary waveguide transition interface 268 in the second environment 253. The secondary waveguide transition interface 268 can act as a seal to prevent different temperatures and/or pressures of the second environment 253 from directly contacting the first portion 260 of the waveguide 250. The first waveguide medium 254 and the second waveguide medium 264 can be different gasses or liquids, such as air, oil, fuel, or the like and may have different nominal pressures and/or temperatures. In some embodiments, the first waveguide medium 254 and/or the second waveguide medium 264 is a dielectric. The guidance structure 256 can be a metal tube and may be integrally formed on/within a component of the gas turbine engine 20 of FIG. 1, such as communication path 102 of FIG. 3. The guidance structure may also contain more than one waveguide transition interfaces 258 with a corresponding transition window 266 for redundancy purposes. Although depicted as a single straight path, it will be understood that the waveguide 250 can bend, "T," "Y," and/or branch to reach multiple SCIDs 68A, 68B of FIG. 2.

Multiple methods and systems exist for position sensing in machines. For example, magnetically coupled devices such as linear/rotary variable displacement transducers (LVDT/RVDT) or resolvers can be employed. In other configurations, sensors such as proximity sensors can utilize magnetic field coils to sense the presence or absence of another metallic object in close proximity. Additionally, capacitance sensors can be used to measure small clearances. Finally, EM energy has been demonstrated in clearance measurement systems to detect changes in the millimeter range. These devices all require their own excitation interconnect system and signal processing system dedicated for each sensor.

However, in accordance with various embodiments of the present disclosure, a multi-stage sensing/control/identification device is provided that enables control and/or communication with multiple different sensors or electromechanical hardware devices. Further, in some embodiments of the present disclosure, multiplexed two-stage tunable position, displacement, and proximity sensors with protected communication are provided. Embodiments of the present disclosure include an EM sensor that operates in a protected environment and uses a tunable excitation signal for measuring displacement.

Figure 6:
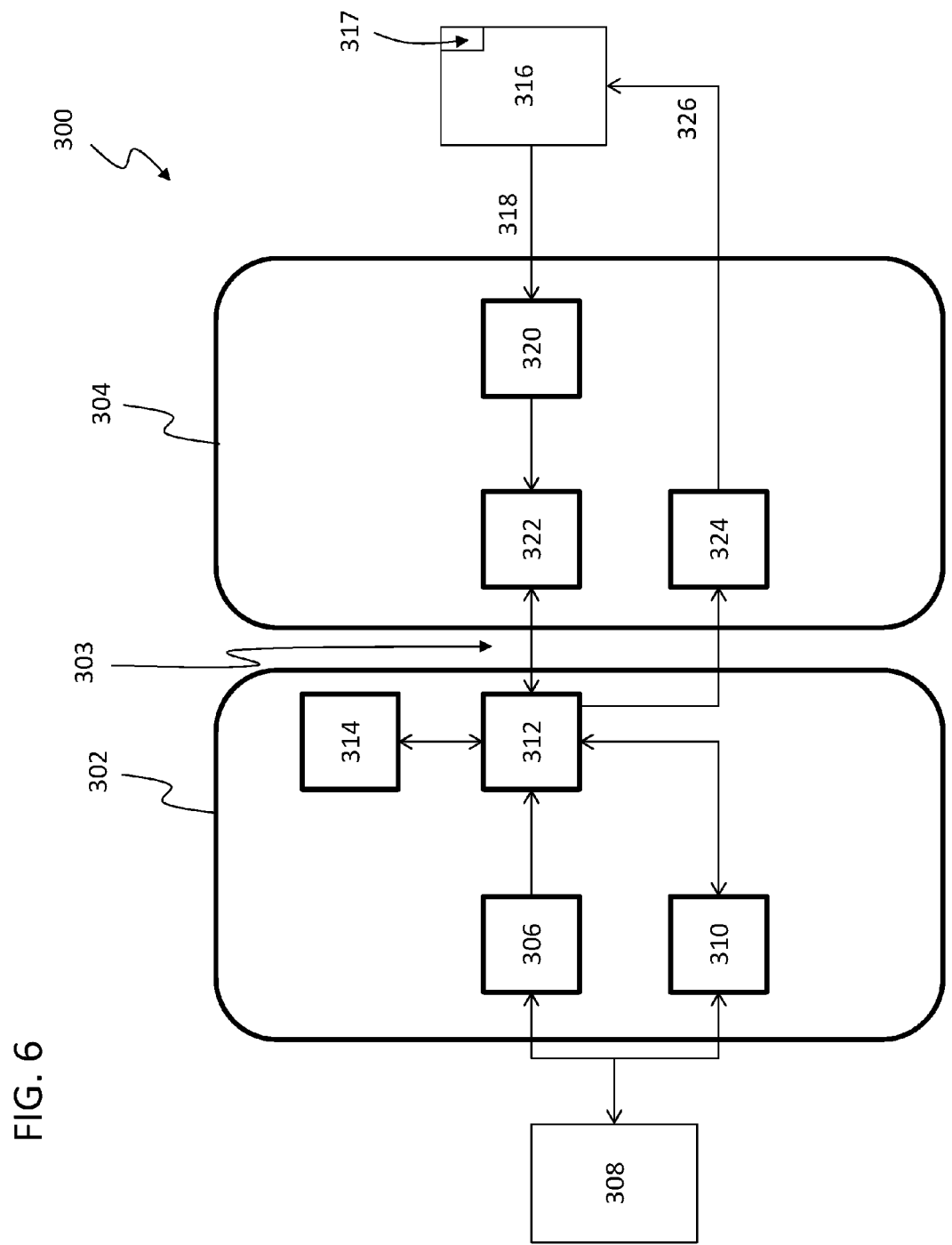
FIG. 6 is a schematic diagram of a multi-stage sensing/control/identification device configuration in accordance with a non-limiting embodiment of the present disclosure.

Turning to FIG. 6, a schematic diagram of a two-stage sensing/control/identification device 300 in accordance with a non-limiting embodiment of the present disclosure. As illustrated the sensing/control/identification device 300 has a two-stage architecture for sensing and/or measuring displacement. That is, as shown, the sensing/control/identification device 300 includes a first stage 302 and a second stage 304. Each of the first and second stages 302, 304 may have dedicated and/or associated shielding, such as described above. That is, the first stage 302 can include or be housed within a first shielding that defines a first shielding volume, and the second stage 304 can include or be housed within a second shielding volume defined within a second shielding. The first and second stages, in some embodiments, are implemented in one package and can share a single or the same shielding, and thus be housed in the same shielded volume. Communication between the first stage 302 and the second stage 304 can be achieved using one or more connections 303, such as planer striplines, traces on a printed circuit boards, or vias within highly integrated System in a Package (SiP). Further, the two-stage sensing/control/identification device 300 can be contained within a network of shielded components in waveguide communication to mitigate unwanted electromagnetic energy from exiting or entering the network, as described herein.

The first stage 302 includes a rectification and power conditioning module 306 configured to receive, rectify, and condition power received from an EM transmitting source 308 via waveguide confinement, such as described herein.

The rectified and conditioned power is then provided to each of the other modules of the SCID 300, as described herein (e.g., modules within both the first and second stages 302, 304). Although shown as separate modules within the stages 302, 304, the various components and features of each stage 302, 304 and/or within the SCID 300 can be configured in more or fewer modules and/or stages, and in one non-limiting embodiment, a single printed circuit board component or system in a package (SiP) can provide all of the functionality described herein for each stage 302, 304. Thus, FIG. 6 and the nomenclature provided herein is not intended to be limiting or to imply that each module or stage is a separate and distinct unit, but rather is used to convey an operation that can be performed by the same or different components of the SCID 300.

In addition to power conditioning, the first stage 302 includes a communication interface module 310 that is configured for communication with the EM transmitting source 308 via the waveguide confinement. That is, the communication interface module 310 is configured to receive and process information received in EM transmissions from the EM transmitting source 308. The communication interface module 310 can be configured to provide communications via waveguide confinement, as described herein. The first stage 302 further includes a control module 312, such as a microcontroller, microprocessor, Field Programmable Gate Array, etc. that can be programmed to control and/or communicate with different sensors and/or electromechanical devices depending on the application needs or requirements. The control module 312 can read and write to a storage module 314 of the first stage 302, such as memory (e.g., volatile and/or non-volatile memory). The storage module 314 can include identification information associated with SCID 300, programs and/or applications to be executed by the control module 312, or other data.

The second stage 304 is configured to interact with, communicate with, and/or control an external sensor or electromechanical device (i.e., hardware device 316). That is, the second stage 304 is configured to receive input or reflected signals 318 from the hardware device 316. As used herein, hardware device 316 can be a sensor, an electromechanical device, or other component or device associated with sensing, control, and/or identification. In some embodiments, the hardware device 316 includes a measurement cavity 317 that is configured to enable sensing of position, proximity, distance, or other characteristic of the hardware device 316 or an associated piece of equipment or component of a machine. The hardware device 316 can provide a hardware input 318 that is input into the second stage 304 at or through a hardware circuit module 320, such as a receiver. The hardware circuit module 320 can be an electrical circuit, module, or component that is selected to interact with the hardware device 316, and thus may vary depending on a particular application or hardware configuration. The hardware input 318 is received at the hardware circuit module 320 and then converted at an input conversion module 322 in the second stage 304. The converted input can then be supplied to the first stage 302 and the control module 312 thereof.

The control module 312 of the first stage 302 can further provide instructions and/or controls to the hardware device 316. For example, the control module 312 can provide instructions to the hardware device 316 through a tunable output module 324 of the second stage 304. The tunable output module 324 can be configured to process and convert instructions or commands from the control module 312 into analog or digital signals and generate an output signal 326.

The tunable output module 324 can be tuned or otherwise programmed by the control module 312 or be configured such that different instructions will prompt the tunable output module 324 to output a specific or predefined output signal 326. In a non-limiting embodiment, the output signal 326 can be a transmission or signal sent from the SCID 300 to the hardware device 316 for position measurements.

Accordingly, in one non-limiting example, the first stage 302 receives power and signal from the EM transmitting source 308 and rectifies and conditions the power for provision to all the elements of the device (e.g. at the rectification and power conditioning module 306). Within the EM signal from the EM transmitting source 308, a communication signal is superimposed to send and receive digital signals. The EM signal is provided through a shielded waveguide, as described above. The processing and memory (e.g., within the control module 312 and storage module 314) can be configured to operate the communication interface module 310 and also control the second stage 304 to sense position, proximity, and/or clearance. The purpose of the second stage 304, in such an embodiment, is to provide a tuned excitation signal specific to the measurement cavity within boundary conditions being measured (e.g., output signal 326) and to read a reflection back from the excitation signal at hardware circuit module 320 and convert it to a displacement with the input conversion module 322.

That is, in some embodiments, the second stage 304 can be configured to provide tunable excitation that is specific to a particular hardware device 316. The tunable feature of the excitation (e.g., output signal 326) that is transmitted from the control output module 324 can be used in real-time or at a time of manufacture to adjust the characteristics of the excitation signal (e.g., output signal 326) to provide different frequencies or power levels depending on the geometry of the measurement or based on other parameters or characteristics as known in the art.

The tunable output module 324 and control from the control module 312 can enable different modes of operation. Accordingly, different modes and/or output signals 326 can be output from the tunable output module 324 to detect the wide range of positions to be measured. The output signal 326 can be any type of energy signal, including but not limited to, RF, optic, acoustic, or other forms of energy. As noted above, the first and second stages 302, 304 are shielded to prevent access and/or interference therewith. Further, in some embodiments, the measurement cavity 317 of the hardware device 316 can also be protected from extraneous signal affecting the sensed parameter.

Advantageously, embodiments provided herein enable an ability to harvest energy from an EM signal to power the EM devices such as Control/Sensing Devices and further communicate with an RPU for sending and receiving component information such as serial number, life usage data, and/or environmental data. Further, embodiments provided herein can enable an ability to store fault information data for components if they need to be removed and replaced during maintenance actions and/or associate the stored data in the control component with the proper control component and thus track a history of the device/component. Further, advantageously, embodiments provided herein can enable an ability to measure position, proximity, or displacement using a tunable second stage adaptable to various geometries. The tuning process that may be "burned in" at the time of manufacture of the SCID and/or through a field programming process. Furthermore, the tuning process may be adjustable during operation to allow flexibility (e.g., by an external control or computer and/or the control module of the first stage).

Figure 7:
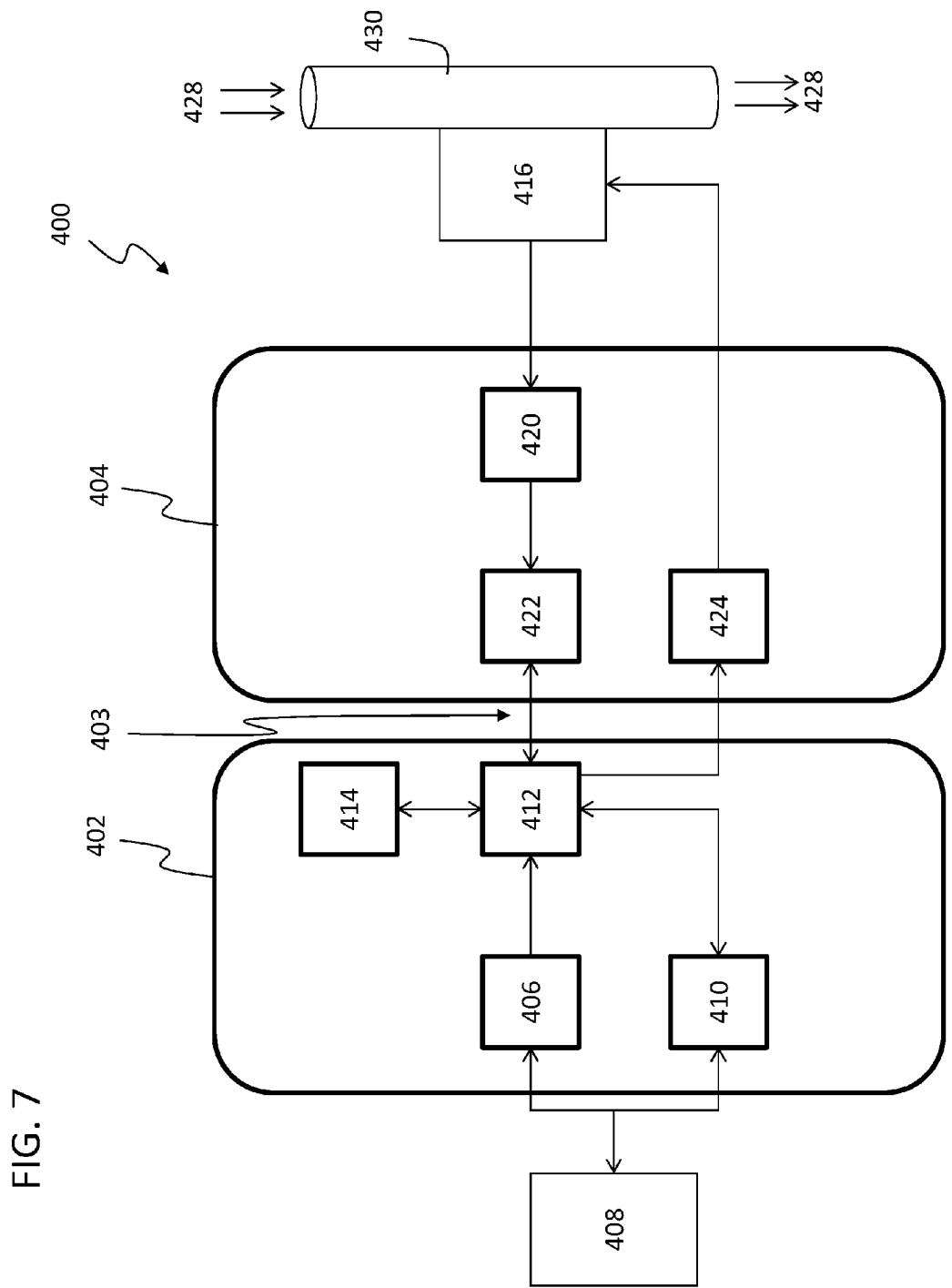
FIG. 7 is a schematic diagram of another multi-stage sensing/control/identification device configuration in accordance with a non-limiting embodiment of the present disclosure.

Turning now to FIG. 7, an alternative configuration of an SCID 400 in accordance with the present disclosure is schematically shown. The SCID 400 is similar to the SCID 300 of FIG. 6, and includes a first stage 402 and a second stage 404. The first stage 402 is configured to communicate with and receive power from an EM transmitting device 408, as described above, and thus includes a rectification and power conditioning module 406, a communication interface module 410, a control module 412, and a storage module 414. The second stage 404 is tunable and configured to interact with a hardware device 416, such as a sensing element. The second stage 404 includes a hardware circuit module 420, an input conversion module 422, and a tunable output module 424, similar to that described above. Communication between the first stage 402 and the second stage 404 can be achieved using one or more connections 403, such as planer striplines, traces on a printed circuit boards, or vias within highly integrated System in a Package (SiP).

The SCID 400 of FIG. 7 is configured for measuring and/or sensing characteristics in fuel and lubrication systems or other fluids to ensure proper operation of the system or machine. Many factors, including low fluid levels, particulate contamination, moisture from condensation or other sources, ice buildup, metallic particles from machine wear, air or other gases from pump cavitation, and corrosive chemicals can all be present in and detected within a fluid using hardware device 416. Most of these introductions to unwanted materials cause a change in dielectric and/or magnetic properties of the fluid in question. Introduction of these unwanted substances into machines may affect reliability and in some cases, safety of operation.

To sense and/or detect the contaminants, the second stage 404 is configured to employ a tunable secondary EM signal to excite and read fluid properties based on changing dielectric and magnetic properties within a fluid 428 that flows through a flow path 430 of the machine. The tunable secondary EM signal may be similar to the output signal 318 of FIG. 6, and can be tuned to enable detection of contaminants within the fluid 428 or other fluid properties.

That is, in a non-limiting example, embodiments provide a two-stage fluid quality measurement sensor (e.g., SCID 400) that uses EM propagation characteristics to detect unwanted fluid conditions, characteristics, and/or properties. The first stage 402 receives power and signal from the EM transmitting source 408 and rectifies and conditions the power for provision to all the elements of the SCID 300/400 (e.g., at the rectification and power conditioning module 306/406). The transmissions from the EM transmitting source 408 can be provided via waveguide confinement, as described herein. Within the EM signal transmitted from the EM transmitting source 308/408 a communication signal is superimposed to send and receive digital signals. The EM signal is provided through a shielded waveguide, as described above. The processing and memory (e.g., control module 312/412, storage module 314/414) can be configured to operate the communication interface module 310/410 and also control the second stage 304/404 to sense position, proximity, clearance, fluid characteristics, etc.

In the embodiment of FIG. 7, the purpose of the second stage 404 is to provide a tuned excitation signal specific to the sensing element (e.g., hardware device 416) for fluid measurement and to read a signal back from device and convert it using the hardware circuit module 420 and the input conversion module 422. The sensing device (e.g., hardware device 416) may consist of a coil or an EM tuned device to emit and read back a signal from the fluid 428. The sensor excitation output from the tunable output module 424 may be RF, optic, acoustic, or other form of energy. In some embodiments, the flow path 430 (e.g., measurement volume and flow) can be protected from extraneous signal affecting the sensed parameter. In some embodiments, the tunable feature of the sensor excitation can be used in real-time or at the time of manufacture to adjust the characteristics of the excitation signal to provide different frequencies or power levels depending on the detection mode of the SCID 400. Different modes may be required to detect the wide range of anomalies previously mentioned.

Signal processing for the conditioned signal (received from input conversion module 422) can be performed by the control module 412 of the first stage 402. In some non-limiting embodiments, a "normal" characteristic of the fluid 428 can be loaded into the storage module 414 to set a baseline against which any anomalous condition would be used for comparison. Further, in some embodiments, due to the tunable nature of the second stage 404 more than one sensor could be used for redundancy to decrease the probability of false detects. Accordingly, advantageously, embodiments of the present disclosure can enable an ability to measure various types of fluids and contaminants in the fluids. Further, embodiments provided herein provide an ability to tune the sensor excitation in real-time for various operating conditions to detect different anomalies within a fluid. Furthermore, in accordance with embodiment provided herein, an ability to store baseline expected operating profiles in memory for comparison to actual operation is provided and can reduce false alarm probabilities.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

The invention claimed is:

1. A sensing/control/identification device of a machine, the device comprising:
    a first stage including:
        a rectification and power conditioning module configured to receive electromagnetic (EM) transmissions from an EM transmitting source via waveguide confinement and convert said EM transmissions to electrical power;
        a communication interface module configured to receive power from the rectification and power conditioning module and at least one of receive the EM transmissions or transmit EM communications via waveguide confinement; and
        a control module configured to receive EM transmission data from the communication interface for processing or preparing the EM communications for transmission from the communication interface module;

a second stage including:
a tunable control module configured to process and convert instructions or commands from the control module of the first stage into analog or digital signals and generate and transmit an output signal; and
at least one connection between the first stage and the second stage to enable communication between the first stage and the second stage.

2. The device as recited in claim 1, the first stage further comprising a storage module, wherein the control module is configured to at least one of read from or write to the storage module.

3. The device as recited in claim 2, wherein the storage module includes at least one of (i) one or more of programs and applications to be executed by the control module, (ii) identification data associated with the device, (iii) historical data associated with the device, (iv) characterization curves associated with the machine, (v) an engine installation, (vi) flight profiles, (vii) environmental data, or (viii) baseline fluid characteristics.

4. The device as recited in claim 1, the second stage further comprising a sensor circuit module configured to interface between a hardware device and the second stage.

5. The device as recited in claim 4, the second stage further comprising a conversion module configured to convert a signal from the hardware device to a signal to be processed by the control module of the first stage.

6. The device as recited in claim 1, wherein the rectification and power conditioning module, the communication interface module, the control module, a conversion module, and a sensor circuit module are all configured on a single printed circuit board or a highly integrated circuit such as a system in a package (SiP).

7. The device as recited in claim 1, wherein the first stage and the second stage are contained within a network of shielded components to mitigate unwanted electromagnetic energy from exiting or entering the network, said shielded components in waveguide communication.

8. A system for a gas turbine engine, the system comprising:
a component;
a hardware device operably connected to the component and configured to measure a characteristic of the component;
an electromagnetic (EM) transmitting source located remote from the component; and
a sensing/control/identification device configured on or proximate to the component, wherein the sensing/control/identification device includes:
a first stage including:
a rectification and power conditioning module configured to receive electromagnetic (EM) transmissions from an EM transmitting source via waveguide confinement and convert said EM transmissions to electrical power;
a communication interface module configured to receive power from the rectification and power conditioning module and at least one of receive the EM transmissions or transmit EM communications via waveguide confinement; and
a control module configured to receive EM transmission data from the communication interface for processing or preparing the EM communications for transmission from the communication interface module;

a second stage including:
a tunable control module configured to process and convert instructions or commands from the control module of the first stage into analog or digital signals and generate and transmit an output signal; and
at least one connection between the first stage and the second stage to enable communication between the first stage and the second stage.

9. The system as recited in claim 8, the first stage further comprising a storage module, wherein the control module is configured to at least one of read from or write to the storage module.

10. The system as recited in claim 9, wherein the storage module includes at least one of (i) one or more of programs and applications to be executed by the control module, (ii) identification data associated with the device, (iii) historical data associated with the device, (iv) characterization curves associated with the machine, (v) an engine installation, (vi) flight profiles, (vii) environmental data, or (viii) baseline fluid characteristics.

11. The system as recited in claim 8, the second stage further comprising a sensor circuit module configured to interface between the hardware device and the second stage.

12. The system as recited in claim 11, the second stage further comprising a conversion module configured to convert a signal from the hardware device to a signal to be processed by the control module of the first stage.

13. The system as recited in claim 8, wherein the rectification and power conditioning module, the communication interface module, the control module, a conversion module, and a sensor circuit module are all configured on a single printed circuit board or a highly integrated circuit such as a system in a package (SiP).

14. The system as recited in claim 8, wherein the hardware device includes a measurement cavity and wherein the tunable control module is configured to output a signal tuned to the measurement cavity.

15. The system as recited in claim 8, wherein the hardware device is a sensing element communicably attached to a flow path, the sensing element configured to measure a characteristic of a fluid within the flow path.

16. The system as recited in claim 15, wherein the tunable control module is configured to output a signal tuned to the fluid within the flow path.

17. The system as recited in claim 8, further comprising a plurality of hardware elements, wherein the tunable control module is configured to communicate with each of the plurality of hardware elements.

18. The system as recited in claim 8, wherein the component is at least one of a compressor vane segment or a component in the gas turbine engine that requires control or monitoring functions.

19. The system as recited in claim 8, wherein the first stage and the second stage are contained within a network of shielded components to mitigate unwanted electromagnetic energy from exiting or entering the network, said shielded components in waveguide communication.

20. The system as recited in claim 8, wherein the control/sensing/identification device is contained within a network of shielded components in waveguide communication to mitigate unwanted electromagnetic energy from exiting or entering the network.

* * * * *